(12) United States Patent
Chusseau et al.

(10) Patent No.: US 12,342,479 B2
(45) Date of Patent: Jun. 24, 2025

(54) EQUIPMENT COMPRISING A SOUND BOX PROVIDED WITH AT LEAST ONE AMPLIFIER

(71) Applicant: SAGEMCOM BROADBAND SAS, Bois-Colombes (FR)

(72) Inventors: Hugo Chusseau, Bois-Colombes (FR); Radu Nedelcu, Bois-Colombes (FR); Arnaud Ferreira, Bois-Colombes (FR); Dominique Susini, Bois-Colombes (FR); Stéphane Delplace, Bois-Colombes (FR)

(73) Assignee: SAGEMCOM BROADBAND SAS, Bois-Colombes (FR)

( * ) Notice: Subject to any disclaimer, the term of this patent is extended or adjusted under 35 U.S.C. 154(b) by 47 days.

(21) Appl. No.: 18/531,215

(22) Filed: Dec. 6, 2023

(65) Prior Publication Data
US 2024/0188235 A1    Jun. 6, 2024

(30) Foreign Application Priority Data

Dec. 6, 2022 (FR) ..................... 2212833

(51) Int. Cl.
*H05K 5/02* (2006.01)
*H04R 1/02* (2006.01)
*H04R 1/08* (2006.01)

(52) U.S. Cl.
CPC ........... *H05K 5/0209* (2022.08); *H04R 1/025* (2013.01); *H04R 1/08* (2013.01); *H04R 2201/028* (2013.01); *H04R 2205/024* (2013.01); *H04R 2205/026* (2013.01)

(58) Field of Classification Search
CPC .... H04R 1/025; H04R 1/08; H04R 2201/028; H04R 2205/024; H04R 2205/026
USPC ......................................................... 381/308
See application file for complete search history.

(56) References Cited

U.S. PATENT DOCUMENTS

| | | | |
|---|---|---|---|
| 11,159,865 B1* | 10/2021 | Johnson | H04R 1/026 |
| 2014/0355806 A1* | 12/2014 | Graff | H04R 1/2834 381/334 |
| 2016/0010846 A1 | 1/2016 | Wu | |
| 2016/0014487 A1* | 1/2016 | Yang | H04R 1/2888 381/394 |

(Continued)

FOREIGN PATENT DOCUMENTS

| | | | |
|---|---|---|---|
| CN | 106231453 A | * | 12/2016 |
| CN | 211406453 U | | 9/2020 |

(Continued)

*Primary Examiner* — Sean H Nguyen
(74) *Attorney, Agent, or Firm* — MUNCY, GEISSLER, OLDS & LOWE, P.C.

(57) ABSTRACT

Equipment including a casing wherein are located: a box; a first loudspeaker disposed inside the box, the first loudspeaker being arranged to broadcast sounds outwards from the casing; a main electronic board placed in the casing outside of the box and on which is mounted, at least one power supply module producing a first power supply voltage; a connecting device passing through the wall of the box; a secondary electronic board inside the box on which is mounted, at least one first amplifier connected to the first loudspeaker, the secondary electronic board being connected to the main electronic board via the connecting device to power the first amplifier with the first voltage.

16 Claims, 10 Drawing Sheets

(56) References Cited

U.S. PATENT DOCUMENTS

2020/0100030 A1    3/2020  Nelson et al.
2020/0204909 A1*   6/2020  Stanley .................. H04R 1/025

FOREIGN PATENT DOCUMENTS

FR           3110797 A1   11/2021
WO      WO2021136962 A1    7/2021

* cited by examiner

A-A

EQUIPMENT COMPRISING A SOUND BOX PROVIDED WITH AT LEAST ONE AMPLIFIER

The present invention relates to the field of equipment comprising a casing containing a box and having at least one first loudspeaker disposed inside the box to broadcast sounds outwards from the casing.

BACKGROUND OF THE INVENTION

Such a piece of equipment integrates, in a casing containing electronic boards, a box having particular sound qualities, this equipment thus being particularly compact (as the box is integrated in the casing, this box not being a chamber external to the casing) and of improved sound quality, since on the one hand, the sound features offered by the box are directly present in the casing, and since on the other hand, the first loudspeaker receives an audio signal which is directly generated in the casing for the first loudspeaker which is also located in the casing.

However, it has been observed that the presence of these elements in one same casing can induce a heating of electronic components.

In certain cases, for example during a high-power listening, the heating of certain electronic components can be damaging to their performance.

To avoid the disadvantages of an overheating, it is sometimes necessary to limit the power delivered to the first loudspeaker, which is damaging to the listening experience.

AIM OF THE INVENTION

An aim of the invention is to provide a piece of equipment comprising a casing, wherein are located, a box, a first loudspeaker disposed inside the box and a main electronic board placed in the casing, outside of the box, the equipment making it possible to resolve or at least mitigate all or some of the abovementioned disadvantages of the prior art.

SUMMARY OF THE INVENTION

To this end, according to the invention, a piece of equipment is proposed, comprising a casing, wherein are located:
a box;
a first loudspeaker disposed inside the box and mounted at a wall of the box, the first loudspeaker being arranged to broadcast sounds outwards from the casing;
a main electronic board placed in the casing outside of the box, and on which is mounted, at least one power supply module arranged to produce a first power supply voltage;
a connecting device passing through the wall of the box;
a secondary electronic board placed inside the box and on which is mounted, at least one first amplifier connected to the first loudspeaker, the secondary electronic board being electrically connected to the main electronic board via the connecting device, such that the first amplifier is powered by the first power supply voltage.

The box of the equipment according to the invention is a sound box containing at least one first loudspeaker, this box thus being intended for the broadcasting of sounds from the first loudspeaker outwards from the box and more specifically, outwards from the casing of the equipment.

Thanks to the invention, the first amplifier and the first loudspeaker are located in the box, away from the main electronic board and away from the power supply module which are, in the casing, but outside of the box.

In this way, the first amplifier is less subjected to the thermal effects generated at the main electronic board (the power supply module generates heat), and reciprocally, the main electronic board is less subjected to the thermal effects generated at the first amplifier.

The invention makes it possible to minimise the need to limit the amplification increase of the first amplifier during its operation to avoid overheating.

Correspondingly, the need to limit the sound power delivered by the first loudspeaker to avoid overheating is widely minimised by the invention.

Moreover, the greater the distance between the first amplifier and the first loudspeaker, the greater the electromagnetic interference emitted or received along the connection between the first amplifier and the first loudspeaker are.

By placing the first amplifier and the first loudspeaker in one same box, the invention makes it possible to minimise the distance between the first amplifier and the first loudspeaker, which limits the level of electromagnetic interference emitted or received at the connection between the first connected amplifier and the first loudspeaker.

BRIEF DESCRIPTION OF THE DRAWINGS

Other features and advantages of the invention will clearly emerge from the description, which is made below, for information purposes, and in a not-at-all limiting manner, in reference to the accompanying drawings, wherein:

FIG. 8 is a schematic view of the equipment according to the invention making it possible to illustrate a particular embodiment, where the box 2 comprises a heat dissipater 10 disposed against the bottom 2f of the box 2, this FIG. 8 also illustrates the sound path 26 for broadcasting sounds generated by the first loudspeaker 3a.

DETAILED DESCRIPTION OF THE INVENTION

Figure 1:
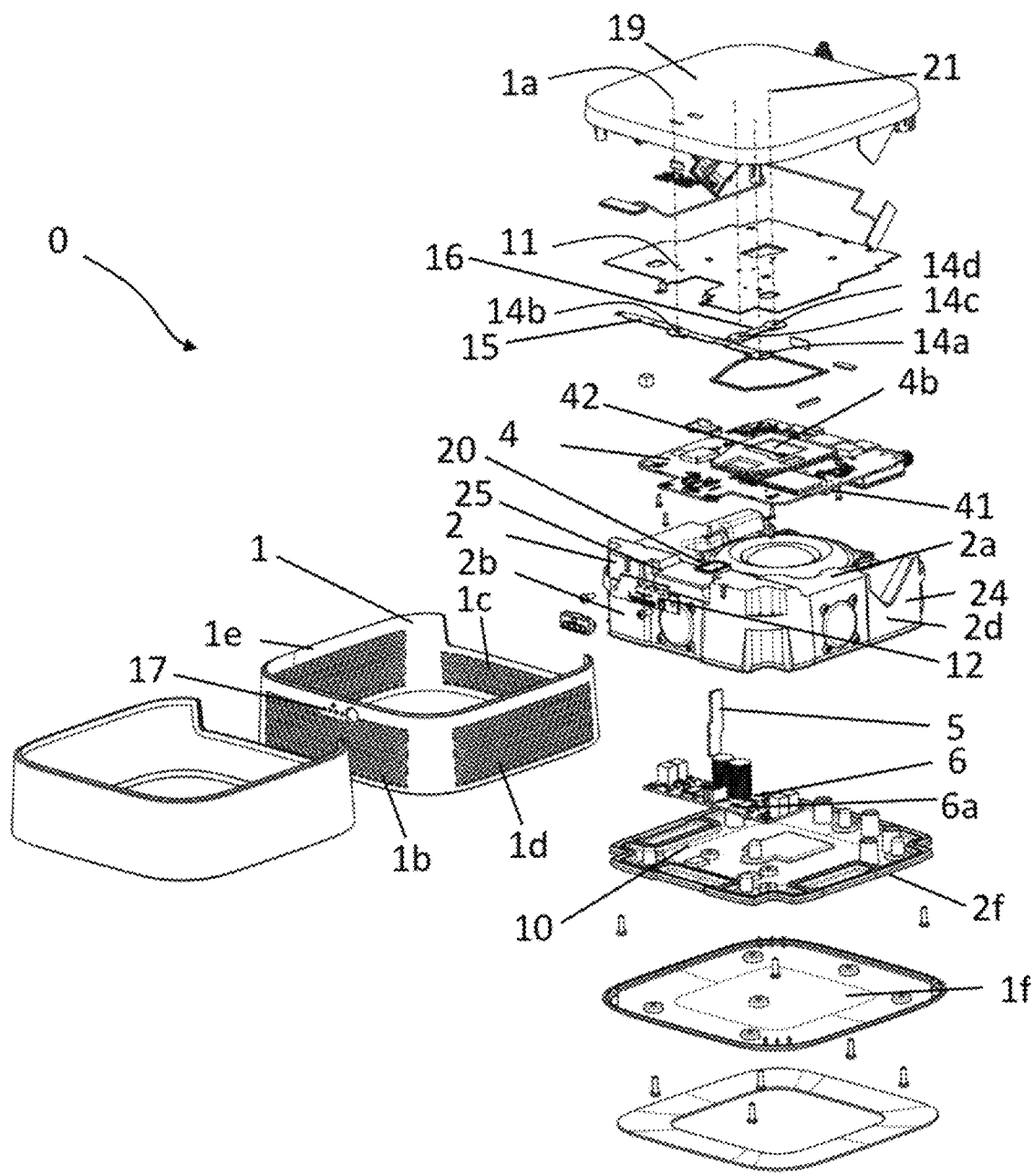
FIG. 1 is an exploded view of the equipment according to the invention.
Figure 2:
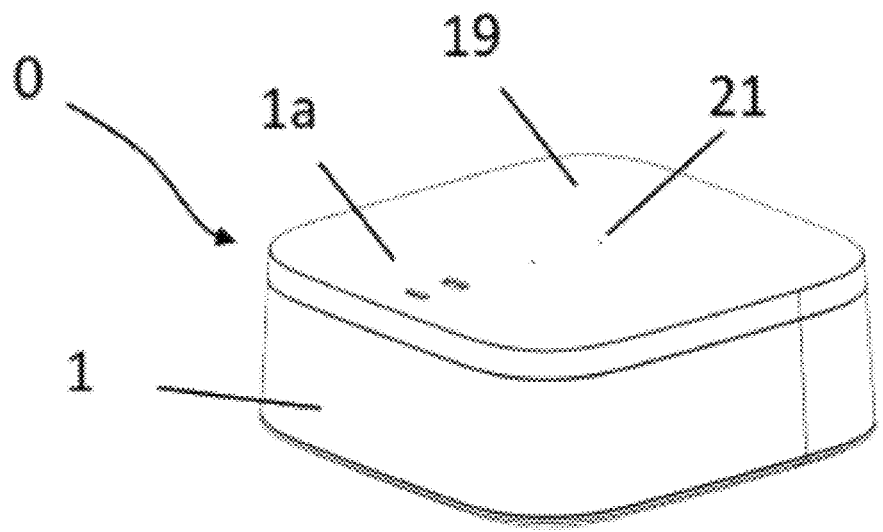
FIG. 2 is a perspective view of the equipment 0 according to the invention.

In reference to FIG. 1, the invention mainly relates to a piece of equipment 0 comprising a casing 1, wherein are located:
- a box 2;
- a first loudspeaker 3a disposed inside the box 2 and mounted at a wall 2a of the box 2, the first loudspeaker 3a being arranged to broadcast sounds outwards from the casing 1;
- a main electronic board 4 placed in the casing 1 outside of the box 2 and on which at least one power supply module 41 is mounted, arranged to produce a first power supply voltage;
- a connecting device 5 passing through the wall 2a of the box 2;
- a secondary electronic board 6 placed inside the box 2 and on which at least one amplifier 6a is mounted, connected to the first loudspeaker 3a.

According to the invention, the secondary electronic board 6 is electrically connected to the main electronic board 4 via the connecting device 5, such that the first amplifier 6a is powered by the first power supply voltage.

Thus, the amplifier 6a (as well as the second amplifier 6b which will be presented below) is placed in the box 2, at a distance from the main electronic board 4 which is a "hot board" (i.e. a board, the components of which have a significant heat emission) carrying the power supply module 4.

As these amplifiers 6a, 6b are not heated by the main board 4 and are better cooled, it is subsequently possible to preserve the amplifiers from a heating due to the components present on the board 4, and it is also possible to use more powerful amplifiers without risking overheating.

For example, a power supply voltage of the amplifiers of 12V can be passed to a power supply voltage of 16V, so as to take better advantage of the first loudspeaker 3a, which is, in this case, a woofer (typically, a loudspeaker intended to reproduce frequencies less than 1 kHz, for example, frequencies less than 500 Hz).

As the amplifiers are better cooled and less impacted by the heat release of the other components, it is possible to make them operate at a higher power, and it is moreover possible to choose higher-power amplifiers, but having a lesser yield (therefore, having a greater heat release for the same audio power played back).

This can be useful, for example if it is sought to change amplifier or component references, while having a limited overheating risk of these components.

The main electronic board 4 carries at least one processor 4b having a decoder function, memories, a power supply module 41 to generate at least one first power supply voltage and an audio module 42.

As can be seen in FIGS. 1, 7a, 7b and 8, the connecting device 5 comprises an intermediate board 5 carrying a first plurality of electrical conductors 50 to supply power to the first amplifier 6a with the first power supply voltage.

The intermediate board 5 and the electrical conductors 50 pass through an opening 20 formed through the wall 2a of the box 2.

Such an intermediate board 5 (preferably of the printed circuit board type, is more advantageous than an electrical conductors layer, as the board 5 is rigid and makes it possible to increase the cross-section of the electrical conductors 50 to obtain a better current passage capacity.

In addition, the assembly of a "rigid" intermediate board 5 with respect to a layer, is easier to automatically produce than the assembly of a "flexible" layer, which requires human intervention. The main electronic board 4 carries a first mechanical connector 40 and the secondary electronic board 6 carries a second mechanical connector 60.

The intermediate board 5:
- carries, on the one hand, a first mechanical connector 51 removably connected to the first mechanical connector 40 carried by the main electronic board 4; and
- carries, on the other hand, a second mechanical connector 52 of the intermediate board 5 removably connected to the second mechanical connector 60 carried by the secondary electronic board 6;

such that the first power supply voltage is transmitted to the first amplifier 6a by way:
- of the first mechanical connector 40 carried by the main electronic board 4;
- of the first and second mechanical connectors 51, 52 carried by the intermediate card 5; and by
- the second mechanical connector 60 carried by the secondary electronic board 6.

These mechanical connectors 40, 51, 52, 60 are electrically connected in series.

In this case, the connectors 51 and 52 of the intermediate board 5 are made by simple electrical tracks formed on terminal end portions of the intermediate board 5, these connectors 51, 52 being of the male type, in this case.

Although these connectors 51 and 52 are, in this case, simple tracks, they could also be made with other more complex connector types, comprising additional parts with interlockings and/or keys.

Each of the electrical conductors 50 of the first plurality of electrical conductors carried by the intermediate board 5 has:
- a first specific end electrically connected to the first mechanical connector 51 carried by the intermediate board 5; and
- a second specific end electrically connected to the second mechanical connector 52 carried by the intermediate board 5.

In this way, the electrical connection between the main electronic board 4 and the secondary electronic board 6 is made, reversibly, via the mechanical connectors 51, 52 electrically connected to one another via the first plurality of electrical conductors 50.

As the intermediate board 5 is rigid, its connection on the second mechanical connector 60 carried by the secondary board 6 makes it possible to spatially position the first mechanical connector 51 of the intermediate board 5 with respect to the main electronic board 4.

Thus, the electrical connection between the main electronic board 4 and the secondary electronic board 6 is particularly easy to implement automatically.

Figure 7A:
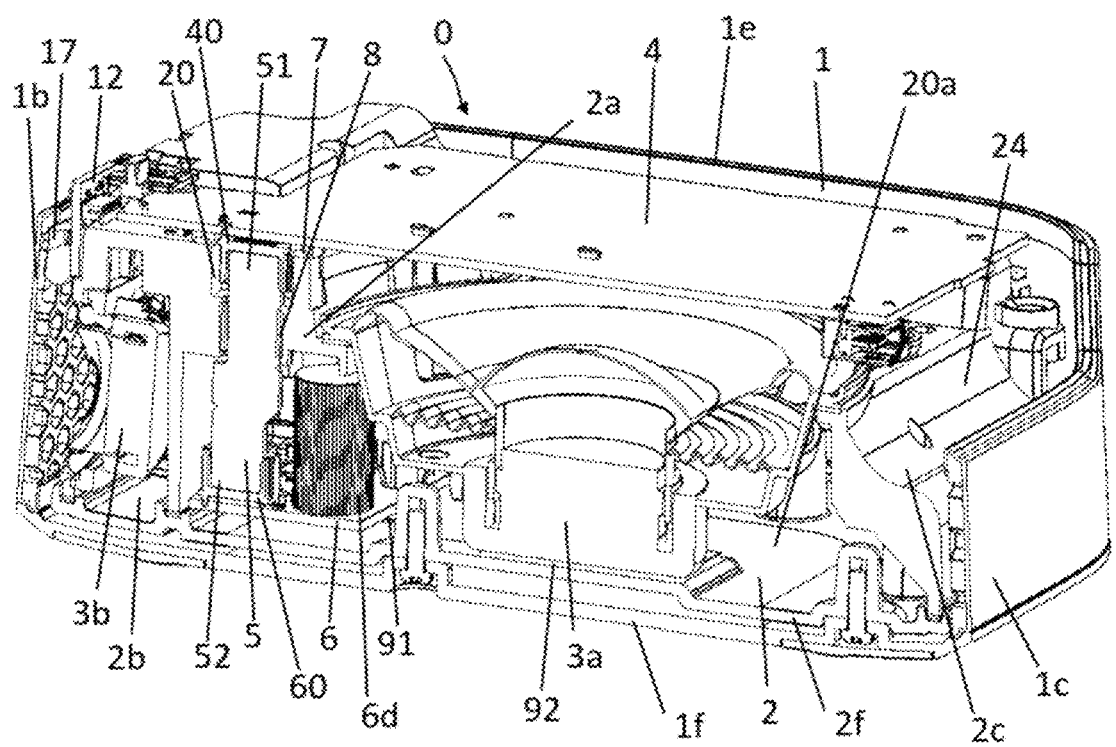
FIG. 7a is a perspective view of the equipment 0 cut along a plane PO (which can be seen in FIG. 5a), the equipment is illustrated without its upper cover 19 to show the electrical connection between the main board 4 and the secondary board 6 via the intermediate board 5.
Figure 7B:
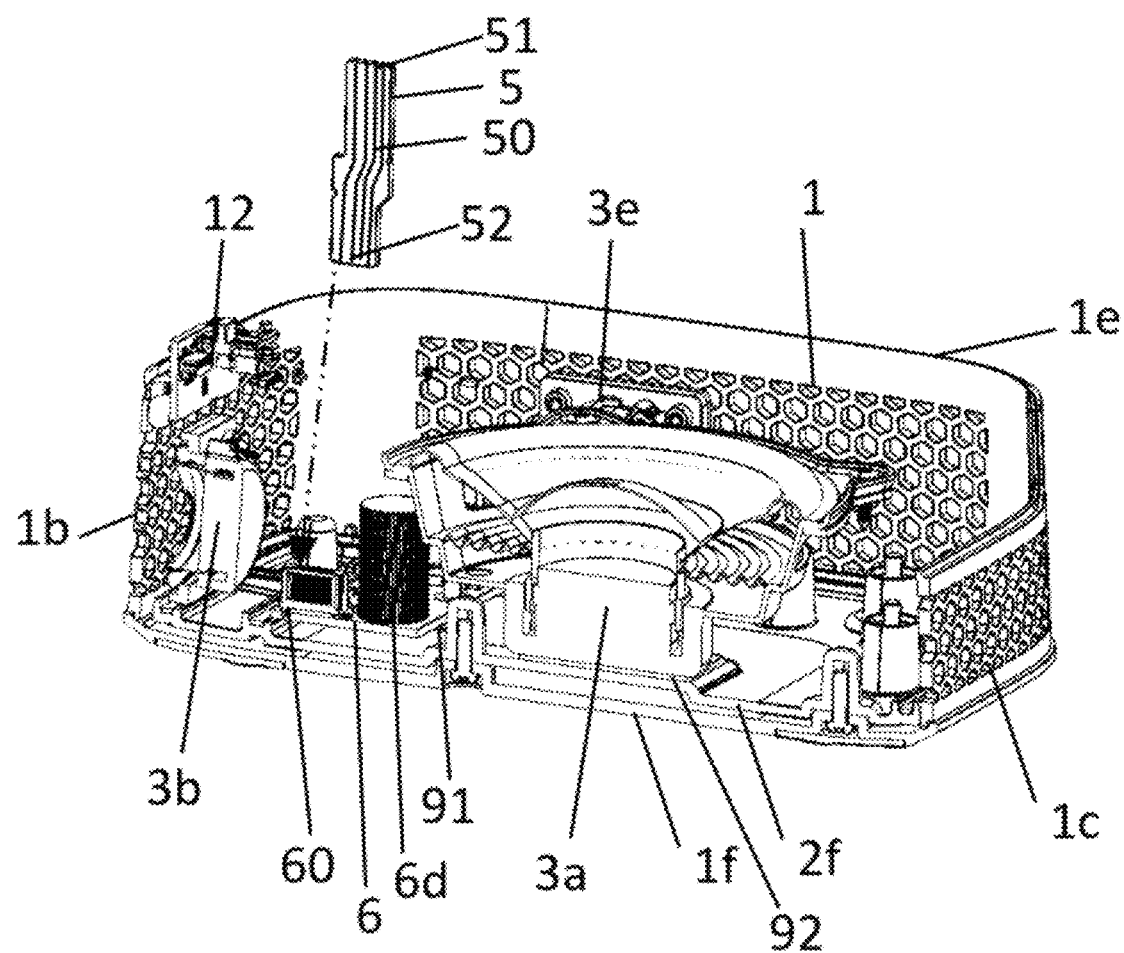
FIG. 7b is a perspective view of the equipment 0 cut along a plane PO (which can be seen in FIG. 5a), the equipment is illustrated without its upper cover and without the main board for the assembly of the intermediate board 5 on the secondary board 6b before the box is closed with the part defining the upper, right, left, front and rear walls of the box.

In the preferable embodiment illustrated in FIG. 7a, one of the first mechanical connectors 51 is a male-type connector interlocked in the other of said first mechanical connectors 40 which is a female-type connector.

These first mechanical connectors 40, 51 are, in this case, connected to one another, so as to have a first clearance enabling a relative movement between these first mechanical connectors 40, 51.

Similarly, one of the second mechanical connectors 52 is a male-type connector interlocked in the other of said second mechanical connectors 60 which is a female-type connector.

These second mechanical connectors 52, 60 are, in this case, connected to one another, so as to have a second clearance enabling a relative movement between these second mechanical connectors 52, 60.

These first and second clearances between the connectors enable:
- a better resistance in case of equipment accidentally falling; and
- a facilitated assembly of the intermediate board 5 vis-à-vis the main 4 and secondary 6 electronic boards (which is favourable to automating the assembly process).

Preferably, the intermediate board 5 extends in length and in width in a plane of the intermediate board 5 which is, on the one hand, perpendicular to a main plane of the main board 4 and, on the other hand, perpendicular to a front face 1b of the casing 1.

The 90° orientation of the intermediate board 5 with respect to the front face 1b of the casing 1 contributes to the resistance to equipment 0 falling.

Indeed, in case of equipment falling, the impact occurs most often at the front face of the casing, i.e along the plane of the intermediate board 5 (in case of falling, the connectors and the board 5 are generally preserved).

The rigid board 5 can also contribute to the robustness of the equipment in case of falling, by avoiding the boards 4 and 6 possibly moving closer to one another at the time of an impact.

Preferably, the first and second mechanical connectors 51, 52 are identical to one another (in this case, these are male connectors of the PCI Express type), and the first and second mechanical connectors 40, 60 respectively carried by the main electronic board 4 and by the secondary electronic board 6 are also identical to one another (in this case, these are female connectors of the PCI Express type).

The fact of having mechanical connectors which are identical to one another, makes it possible to reduce the number of types of components necessary to make the electrical connection between the boards.

As illustrated in FIGS. 5a, 7a, 7b and 8, the intermediate board 5 is preferably of the asymmetric form, such that the electrical connection between the main electronic board 4 and the secondary electronic board 6 via the first plurality of electrical conductors 50 carried by the intermediate board 5 is possible in one single position/orientation of the intermediate board 5 with respect to the main 4 and secondary 6 electronic boards.

The asymmetric form of the intermediate board 5 enables the electrical connection between the boards, only when the intermediate board is in its unique position.

This asymmetric form prohibits positioning the intermediate board 5 in a position/orientation other than said unique position which can be seen in the figures.

This asymmetric form of the intermediate board 5 enables a mechanical keying, which facilitates the assembly of the intermediate board, while making it possible to assign to each electrical conductor 50, a unique function in the electrical connection between the main 4 and secondary 6 boards.

Thus, each electrical conductor 50 can be specifically developed/sized to transport a given current/signal/voltage which is dedicated to it.

Figure 8:
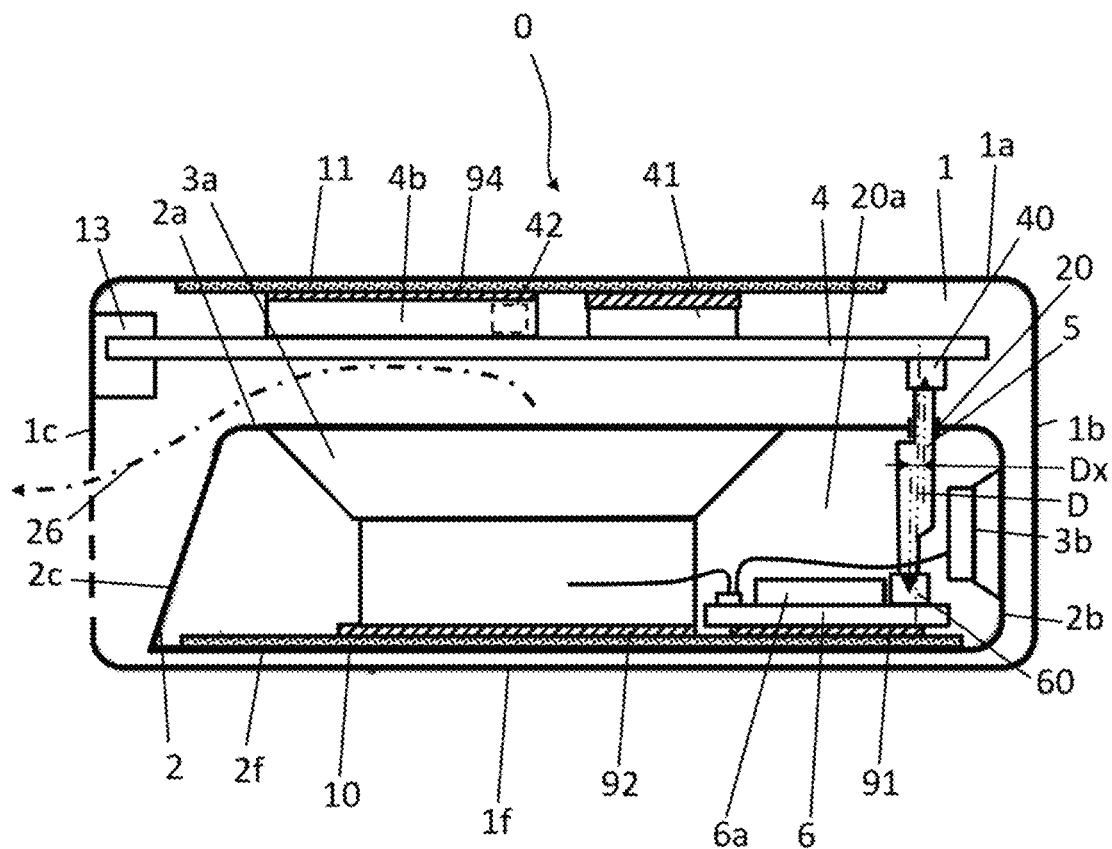

In the present case, as illustrated in FIGS. 1, 5a, 7a, 7b and 8, the asymmetry of the intermediate board 5 is obtained by an axial offsetting Dx between two longitudinal ends of the intermediate board 5 (see, for example, FIG. 8).

The first longitudinal end of the intermediate board 5 is mainly on one side of a longitudinal axis D of the intermediate board 5, while the other longitudinal end of the intermediate board is mainly located on the other side of the longitudinal axis D of the intermediate board 5.

To increase the asymmetric aspect of the intermediate board 5 and facilitate the recognition of the unique position wherein it must be assembled, the intermediate board 5 also comprises:
- a first longitudinal board cut into steps and formed along and on one side of the longitudinal axis of the intermediate board; and
- a second longitudinal edge formed along and on a second side of the longitudinal axis, this second edge having a portion cut at 45° with respect to the longitudinal axis of the intermediate board.

As can be understood in FIGS. 7a and 8, the wall of the box is shaped to abut against the portion cut at 45° when the intermediate board 5 is in a position other than said unique position illustrated in the figures.

Figure 4:
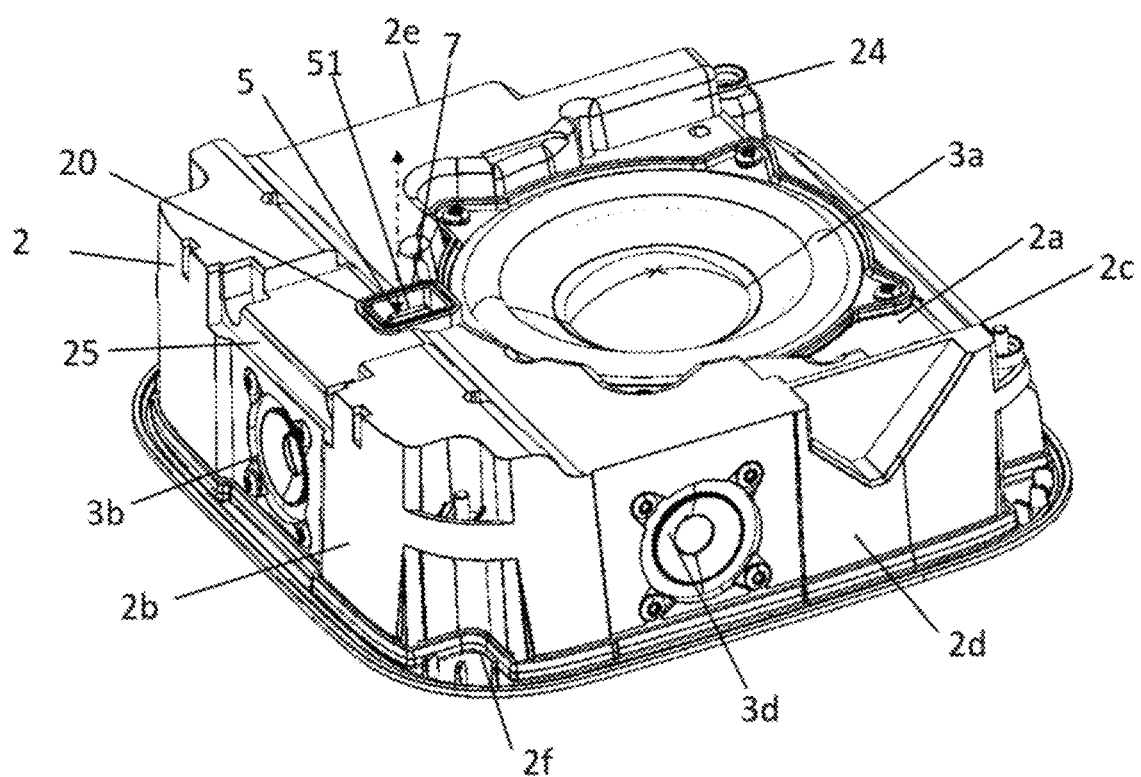
FIG. 4 is a perspective view of the box 2 of the equipment 0.

Preferably, a compressible seal 7, which can be seen in FIGS. 7a and 4 is disposed to oppose the air passage between the inside and the outside of the box 2 via the opening 20 formed through the wall of the box 2.

This seal 7, makes it possible to ensure a sound sealing of the box 2 at the opening 20 through which the intermediate board 5 passes.

Preferably, this seal 7 bears against the main electronic board 4, the latter thus "closing" the sound volume of the box 2.

This seal 7 is preferably an annular seal which extends, in this case, around the first mechanical connector 40 carried by the main electronic board 4.

This seal 7 comprises, in this case, first and second faces formed on either side of the seal.

The first face of the seal bears against an annular bearing surface carried by the main electronic board 4 and the second face of the seal bears against an annular bearing surface carried by the wall 2a of the box 2.

The compression of the seal 7 between the annular bearing surface carried by the main electronic board and the annular bearing surface carried by the wall 2a of the box also makes it possible to absorb vibrations/slight movements of the main electronic board and the box 2.

Interfering vibrations can thus be absorbed by the seal 7.

As illustrated in FIG. 7a, an elastically deformable element 8, preferably made of foam, extends all around a longitudinal portion of the intermediate board 5, inside the opening 20 formed through the wall 2a of the box 2.

This elastically deformable element 8 makes it possible to oppose the contact between the intermediate board 5 and the wall of the box 2.

In this case, the elastically deformable element 8 (in this case, a foam sleeve) surrounds a longitudinal portion of the intermediate board 5 to enable an alignment of the intermediate board 5 with respect to the opening 20.

The assembly of the intermediate board 5 is facilitated.

This sleeve 8 thus makes it possible to absorb/dissipate vibrations and also makes it possible to oppose the air passage along the intermediate board, via the opening 20.

The audio module 42 is placed in the casing 1, outside of the box 2, and is arranged to produce a primary audio signal.

More specifically, the audio module 42 is mounted on the main electronic board 4 and is powered by said power supply module 41 via an electrical connection connecting the power supply module 41 to the audio module 42.

The audio module 42 is also connected to the secondary electronic board 6, such that when the primary audio signal is applied at the input of the first amplifier 6a and that the first amplifier 6a is powered by said first voltage, the first amplifier 6a produces, from the primary audio signal, a first amplified audio signal sent to the first loudspeaker 3a.

The sounds broadcast by the first loudspeaker 3a are thus a function of the first amplified audio signal, this amplification being made in the box 2, closest to the first loudspeaker 3a and at a distance from the main electronic board 4.

Thus, the risk of electromagnetic interference of the first amplified audio signal is limited, which is favourable to the quality of the sounds broadcast by the equipment 0.

The audio module 42 is electrically connected to the secondary electronic board 6 by way of the connecting device 5, such that the primary audio signal is transmitted from the audio module 42 to the first amplifier 6a by way of the connecting device 5.

More specifically, the audio module 42 is electrically connected to the secondary electronic board 6 by way of audio electrical conductors carried by the intermediate board 5, such that said primary audio signal is transmitted from the audio module 42 to the first amplifier 6a by way of specific audio electrical conductors.

In this way, the intermediate board 5 carries electrical connectors dedicated to the transmission of the power supply voltage to the first amplifier 6a and audio electrical conductors dedicated to the transmission of the primary audio signal to the first amplifier 6a, thus limiting the risk of interfering with the quality of the primary audio signal.

As illustrated in different FIGS. 1, 4, 5a to 8, the equipment 0 further comprises:

- a right loudspeaker 3d disposed in a right inner chamber 20d of the box 2 open on a right side face 2d of the wall of the box 2;
- a left loudspeaker 3e disposed in a left inner chamber 20e of the box 2 open on a left side face 2e of the wall of the box 2; and
- a front loudspeaker 3b disposed in a front inner chamber 20b of the box 2 open on a front face 2b of the wall of the box 2.

The number and the arrangement of these loudspeakers could vary, while remaining in the scope of the present invention.

Said first loudspeaker 3a is, in this case, a loudspeaker of the woofer type (bass sounds being mainly located between 20 and 500 Hz) disposed in a central inner chamber 20a of the box 2 disposed between the right and left inner chambers 20d, 20e of the box 2.

The central inner chamber 20a is open on the upper face 2a of the box, in the direction of the main electronic board 4.

The casing 1 comprises a rear face 1c which is open outwards from the casing 1 to broadcast the sounds coming from the first woofer 3a outwards from the casing.

The airflow generated by the sounds of the first loudspeaker 3a thus contributes to the cooling of the main electronic board 4.

The right, left, front and central inner chambers 20a, 20b, 20d, 20e of the box are sealed against one another.

In this way, each chamber has an internal volume suitable for the main frequencies of the loudspeaker that it contains.

Moreover, the sealing between the chambers favours the separation of sounds generated by the different loudspeakers.

Preferably:

- the right loudspeaker 3d has a main sound axis which is specific to it, and along which the sounds that it generates are mainly broadcast;
- the left loudspeaker 3e has a main sound axis which is specific to it, and along which the sounds that it generates are mainly broadcast;
- the front loudspeaker 3b has a main sound axis Ax which is specific to it, and along which the sounds that it generates are mainly broadcast.

Figure 5A:
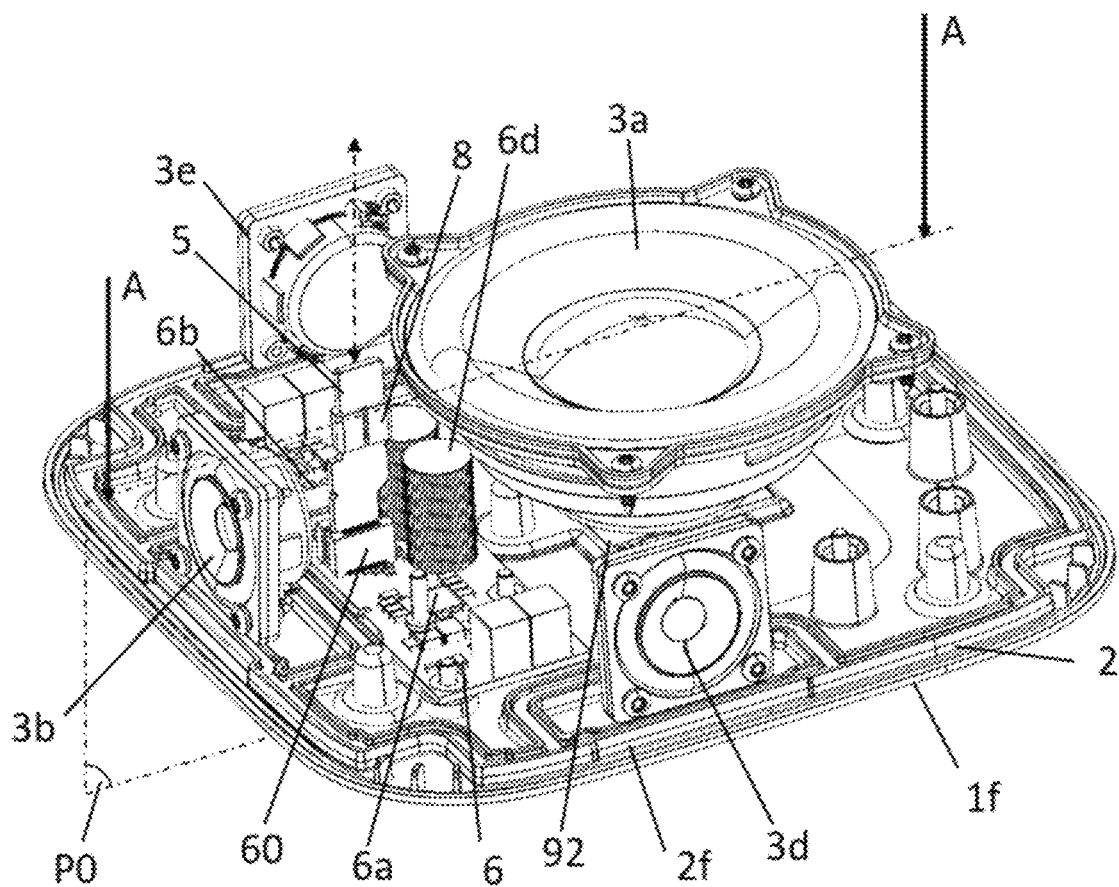
FIG. 5a is a perspective view of the inside of the box 2 with the secondary board 6 which carries the first amplifier 6a (in this FIG. 5a, the parts 24 forming the cover of the casing 2 which comprises the upper, right, left, front and rear walls of the box, is in this case, removed)
Figure 5B:
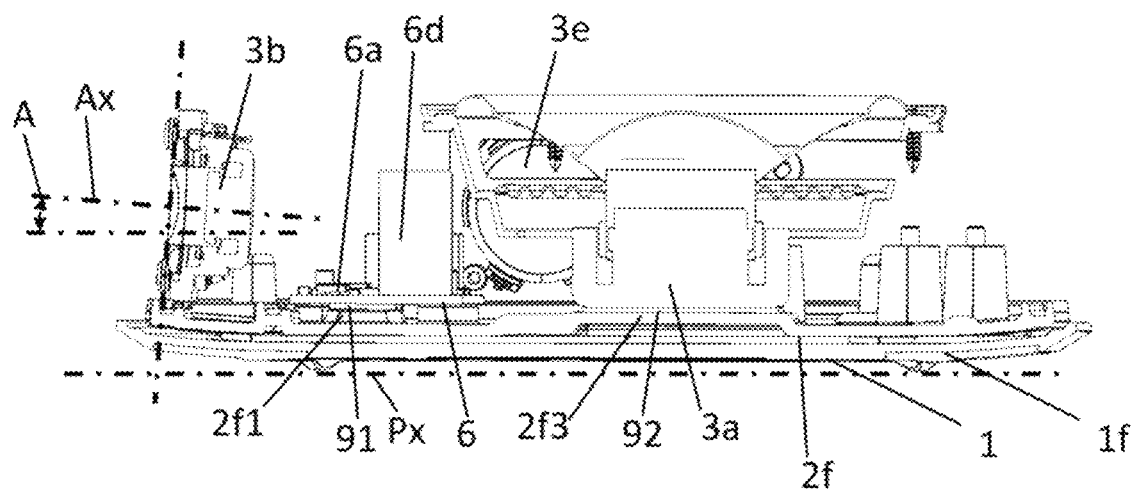
FIG. 5b is a side view of the assembly of the parts illustrated in FIG. 5a, this FIG. 5b illustrating the typical inclination of a loudspeaker (in this case, the front end 3b) with respect to the bottom plane Px defined by the bottom 1f of the casing 1.

As can be understood from the perspective views of the casing 1, 4, 7a and 7b and from the cross-sectional view of FIG. 5b:

- on the one hand, the casing 1 comprises a box bottom 1f defining a support plane Px of the casing (in this case, the plane Px is defined by the feet of the casing intended to carry the equipment on a flat piece of furniture); and
- on the other hand, at least one of said main sound axes of the right, left and front loudspeakers is oriented with respect to the support plane Px, such that the sound mainly broadcast along said at least one sound axis Ax moves progressively away from said support plane Px.

As is understood from FIG. 5b, the main sound axis Ax of the front loudspeaker 3b extends into a plane perpendicular to the support plane Px, where it optionally forms a front angle A with respect to the support plane Px.

This angle is of between 2 and 40° of angle, for example of between 2 and 15° of angle, preferably it is of 3° of angle.

Similarly, the main sound axis of the right loudspeaker 3d extends into a second plane perpendicular to the support plane Px where it optionally forms a right side angle with respect to the support plane Px which is of between 2 and 50° of angle, for example of between 2 and 15° of angle, preferably of 3° of angle.

Symmetrically, the main sound axis of the left loudspeaker 3e extends into said second plane perpendicular to the support plane Px where it optionally forms a left side angle with respect to the support plane Px which is of between 2 and 50° of angle, for example of between 2 and 15° of angle, preferably of 3° of angle.

Preferably, the right side angle and the left side angle have one same angle value.

With a main sound axis of the given loudspeaker forming, in a plane perpendicular to the support plane Px, an angle A, for example of between 2 and 15° with respect to the support plane Px, the sound tends to be broadcast upwards with respect to the support plane Px, i.e. by extending progressively away from this support plane Px.

As the equipment according to the invention is intended to be positioned at the foot of the television screen, the equipment is most often located in quite a low position (between 50 and 80 cm high) with respect to the head of the user observing the television screen.

This positive vertical angle A makes it possible to partially compensate for the height difference.

Optionally, it is possible to have side angles significantly greater than the angle A in order to improve the spatial playback of the sounds emitted by the loudspeakers 3d and 3e (for example, by taking advantage of the sound reflections on the walls and the ceiling of the room) while preserving a direct sound path between the front loudspeaker 3b and the listener.

Optionally, the loudspeakers 3d and 3e have an angle between their main sound axis and the support plane Px, while the front loudspeaker 3b does not have an angle between its main sound axis and the support plane Px which are parallel to one another.

The angle of the loudspeakers 3d and 3e can, for example, be between 15 and 90° (with respect to the plane Px) while the angle of the front loudspeaker 3b will be, for example, between 0 and 20° (with respect to the plane Px).

Preferably, to limit the appearance of sound interferences at the interface between the loudspeakers and the casing:
the main sound axis of the front loudspeaker is perpendicular to the front face of the casing; and/or
the main sound axis of the right loudspeaker is perpendicular to the right side face of the casing or is perpendicular to the upper face of the casing; and/or
the main sound axis of the left loudspeaker is perpendicular to the left side face of the casing or is perpendicular to the upper face of the casing; and/or
the main sound axis of the first loudspeaker is perpendicular to the upper face 1a of the casing defined by an upper cover 19 of the casing.

Preferably:
the front face 1b of the casing 1 has a plurality of sound broadcast perforations defining a front grille opposite the front loudspeaker 3b;
the right side face 1d of the casing 1 has a plurality of sound broadcast perforations defining a right side grille opposite the right loudspeaker 3d;
the left side face 1e of the casing 1 has a plurality of sound broadcast perforations defining a left side grille opposite the left loudspeaker 3e; and
the rear face 1c of the casing 1 has a plurality of sound broadcast perforations defining a rear grille to broadcast sounds generated by the first loudspeaker 3a (central loudspeaker of the woofer type, the membrane of which is oriented towards the main electronic board 4).

The box 2 comprises a lower face 2f extending mainly into a bottom plane of the box and wherein:
a flat portion of the right side face 2d of the wall of the box on which is fixed the right loudspeaker 3d forming an angle with the bottom plane of the box, measured inside the box, which is of between 50 and 88° of angle, preferably 77°;
a flat portion of the left side face 2e of the wall of the box on which is fixed the left loudspeaker forming an angle with the bottom plane of the box, measured inside the box, which is of between 50 and 88° of angle, preferably 77°.

As illustrated in FIG. 4, the box 2 comprises a lower face 2f extending mainly into a bottom plane of the box, a flat portion of the front face 2b of the wall of the box on which is fixed the front loudspeaker 3b forming an angle with the bottom plane 2f, measured inside the box, this angle being of between 50 and 88° of angle, preferably 77°, but it could also be 90°, for example in the case where it would not be sought to orient the sound axis upwards.

As is understood from FIGS. 4, 5a, 5b and 7a, 7b, the flat portions of the right, left side faces and of the front face of the wall of the box on which are respectively fixed the right, left and front loudspeakers, being inclined with respect to the bottom plane 2f of the box which makes it possible to simply obtain the vertical inclination of each of the loudspeakers, while moving it closer towards the inside of the box.

This particular embodiment makes it possible to obtain sounds slightly oriented upwards, while maximising the internal volume of the box.

This embodiment is particularly economical, since it does not involve a bespoke adaptation of each given loudspeaker, nor a use of a wedging part inclined between the box and each given loudspeaker.

Preferably, a second amplifier 6b is mounted on the secondary electronic board 6, and is connected to at least one of said right, left, front loudspeakers, said second amplifier 6b being electrically connected to said power supply module 41 via the connecting device 5 (in this case, via the board 5), such that the second amplifier 6b is electrically powered by the power supply module 41 mounted on the main electronic board 4.

The electrical powering of the second amplifier 6b passes through electrical conductors 50 carried by the intermediate board 5 and by each of said mechanical connectors 40, 51, 52, 60.

The audio module 42 is preferably arranged to produce a secondary audio signal.

This audio module 42 is connected to the secondary electronic board 6, such that when the secondary audio signal is applied at the input of the second amplifier 6b, and that the second amplifier is electrically powered by the power supply module 41, the second amplifier 6b thus produces, from the secondary audio signal, a second amplified audio signal sent to at least one of said right, left and front loudspeakers.

To cope with specific current draws of one and/or the other of the amplifiers 6a, 6b, the secondary board 6 carries at least one energy reserve capacitor 6d (also called power capacitor) electrically powered by the power supply module 41 via the connecting device 5 passing through the wall 2a of the box 2.

Said at least one capacitor 6d is moreover electrically connected to said at least one first amplifier 6a so as to supply energy to said at least one first amplifier and optionally to the second amplifier.

In the embodiment of the invention where the secondary board carries two amplifiers 6a, 6b, it is preferable to have one capacitor per amplifier, to avoid a specific current draw by the first amplifier 6a dedicated to the woofer 3a from interfering with the operation of the second amplifier 6b which powers the other loudspeakers.

Thus, the equipment 0 comprises at least one other energy reserve capacitor also mounted on the secondary board 6 and electrically powered by the power supply module via the connecting device.

This other reserve capacitor can be electrically connected to at least one of said first and/or second amplifiers 6a, 6b to supply energy to these amplifiers.

Each of the energy reserve capacitors mounted on the secondary board makes it possible to store electrical energy coming from the power supply module 41 carried by the main electronic board and, in case of electrical current draw by at least one of the amplifiers, to specifically supply directly available energy, into the box, at the secondary board 6, closest to the amplifiers and to the loudspeakers.

The fact of having one or more reserve capacitors mounted on the secondary board 6, makes it possible to shorten the electrical path between reserve capacitor and amplifier (s) which
- limits the current draws at the power supply module (the power supply module 41 can thus be smaller);
- limits the energy loss between the capacitor and the amplifier;
- improves the response time to the current draw; and
- limits electromagnetic interferences, in particular during the transmission of the charge/power to the amplifier (s).

In other words, the reserve capacitors 6d are capacities disposed closest to the amplifiers to respond to a significant peak consumption, during current draws by the amplifiers.

These capacitors/capacities are large (for example, 2*2200 uF instead of 2*400 uF necessary in a "stable" system), in order to reduce the current draws on said at least one power supply module 41.

In addition to making it possible to reduce the cost of the power supply module which can be smaller, this has a beneficial effect on reducing electromagnetic interferences CEM.

Another effect of the proximity between capacitor (s) and amplifier (s) is the decrease in voltage drops due to resistive losses on the power supply path, therefore an improvement of the audio dynamic (peak power).

The equipment 0 according to the invention mainly constitutes a "Set-Top Box" intended to receive external signals containing audio and video components, to decode these signals and broadcast the audio component via the loudspeakers contained in the box and the video component via display means, external to the equipment.

To this end, the equipment 0 comprises a decoder placed in the casing 1, outside of the box 2, mounted on the main electronic board 4 or on another electronic board distant from the main board 4, this decoder being optionally integrated in a component grouping together several functions (for example, an "SoC—System on Chip"-type component).

This decoder has:
- at least one input connector 43 to receive a signal external to the equipment comprising a video component and an audio component; and
- at least one output connector 44 to broadcast an output signal generated by the decoder according to said external signal, the output signal having at least one video component.

Said at least one input connector 43 is, for example, an optical input to receive an optical signal, transmitted via an optical fibre and coming from an internet server and/or an Ethernet/RJ45-type input to receive an electrical signal coming from an internet server and/or a coaxial input to receive an electrical signal coming from a satellite receiver.

The output connector 44 of the video signal is, for example, an HDMI output being able to be connected to an external display device, like a television or a video projector to any other type of connector suitable for broadcasting a video stream.

The decoder is connected to the audio module 42 and is arranged to:
- generate, according to said external signal received by the decoder, a decoded signal comprising at least one audio component; and to
- transmit the decoded signal to said audio module 42.

The audio module 42 is arranged to generate said primary audio signal according to the decoded signal.

It must be noted that the audio decoding and the application of audio processing (audio processing functions made by the audio module 42) can be performed by one same electronic component (typically a DSP) or by several separate electronic components.

The audio module 42 can be, or not, integrated with the main processor 4b (in this case, an SoC).

In other words, the functions performed by the decoder and the audio module 42 can be, as the case may be, performed on one same electronic component or be distributed over several electronic components distinct from one another.

The input and output connectors 43, 44 of the decoder are each accessible from the outside of the casing 1 via connecting openings made through the wall of the casing 1.

More specifically, each input or output connector 43, 44 is fixed on a rear edge of the main electronic board 4 and the connecting openings are formed through the rear portion 18 of the upper cover 19 of the casing 1.

Thanks to these features, the assembly of the equipment according to the invention is greatly facilitated.

In one single step of fixing the main electronic board 4 in the casing 1, the input 43 and output 44 connectors are also positioned with respect to the casing 1.

In one single step of positioning the casing 1 cover 19 on the rest of the casing 1, the following are performed:
- the wedging of the main board 4 with respect to the cover 19 (thanks to the indented ridges 13 which limit the risk of vibrations between the board 4 and the casing 1); and
- the positioning of each connector 43, 44 facing the connecting opening which corresponds to it (the connecting openings are, in this case, made in the rear portion 19 of the cover 19).

The heat dissipation aspects will now be detailed in reference to FIGS. 1, 3a, 5a, 5b, 6, 7a, 7b and 8.

Preferably, the equipment 0 comprises at least one first heat exchanger material block 91 which is:
- on one side, in contact against a lower face of the secondary electronic board 6; and
- on another side, in contact against an upper face of a heat dissipater 10 fixed to the box 2 to discharge the heat generated at the secondary electronic board 6 outwards from the box 2.

This heat dissipater 10 is, in this case, a bottom 2f of the box 2.

The upper face of this heat dissipater 10 comprises at least one localised boss 2/1 which is in contact against the first heat exchanger material block 91.

This boss 2/1, sometimes called disbursements, makes it possible to move the bottom 1f of the box 2 closest to the zone of the secondary electronic board 6, where heat is sought to be discharged from.

A second heat exchanger material block 92 is:
- on one side, in contact against a lower face of the first loudspeaker 3a (in this case, the lower face of the permanent magnet of the loudspeaker); and
- on another side, in contact against the upper face of the heat dissipater 10 fixed to the box 2 to discharge the heat generated by the first loudspeaker 3a outwards from the box 2.

The heat dissipater 10 fixed to the box 2 is arranged to discharge heat from the inside to the outside of the box 2.

The second heat exchanger material block 92, other than its function of transmitting heat from the first loudspeaker 3a to the heat dissipater 10 also makes it possible to improve the rigidity of the assembly between the first loudspeaker 3*a* and the box 2.

This is useful for loudspeaker models having a chassis, also called "bowl", which is too flexible/deformable.

The chassis/bowl of the loudspeaker 3*a* forms an annular collar flaring from a first collar edge which is attached to a permanent magnet up to a second collar edge on which a membrane of the loudspeaker 3*a* is attached.

It has been noted that the performance of the loudspeaker is generally degraded from 60° C. to 80° ° C., sound distortions thus being able to appear.

At a higher temperature, a definitive degradation of the loudspeaker can even be observed, by loss of magnetic features of its permanent magnet.

The proper cooling of the components/of the first loudspeaker disposed in the box 2 makes it possible to preserve an optimal audio quality, even at a high sound power, while preserving the electronic components.

The service life of the equipment 0 is thus improved.

Each heat exchanger material block 91, 92 preferably has the form of a pad (PAD), but it can also be achieved by a thermal paste cast at the time of mounting against the heat dissipater fixed to the box.

The heat dissipater 10 fixed to the box 2 can be constituted by the bottom 2*f* of the box 2 or by a plate assembled on the bottom of the box.

According to the quantity of heat to be discharged and the dimension of the heat dissipater 10 fixed to the box, this dissipater can be made of polymer material, of metal (for example, of aluminium, or of copper), or any combination of these materials.

Figure 6:
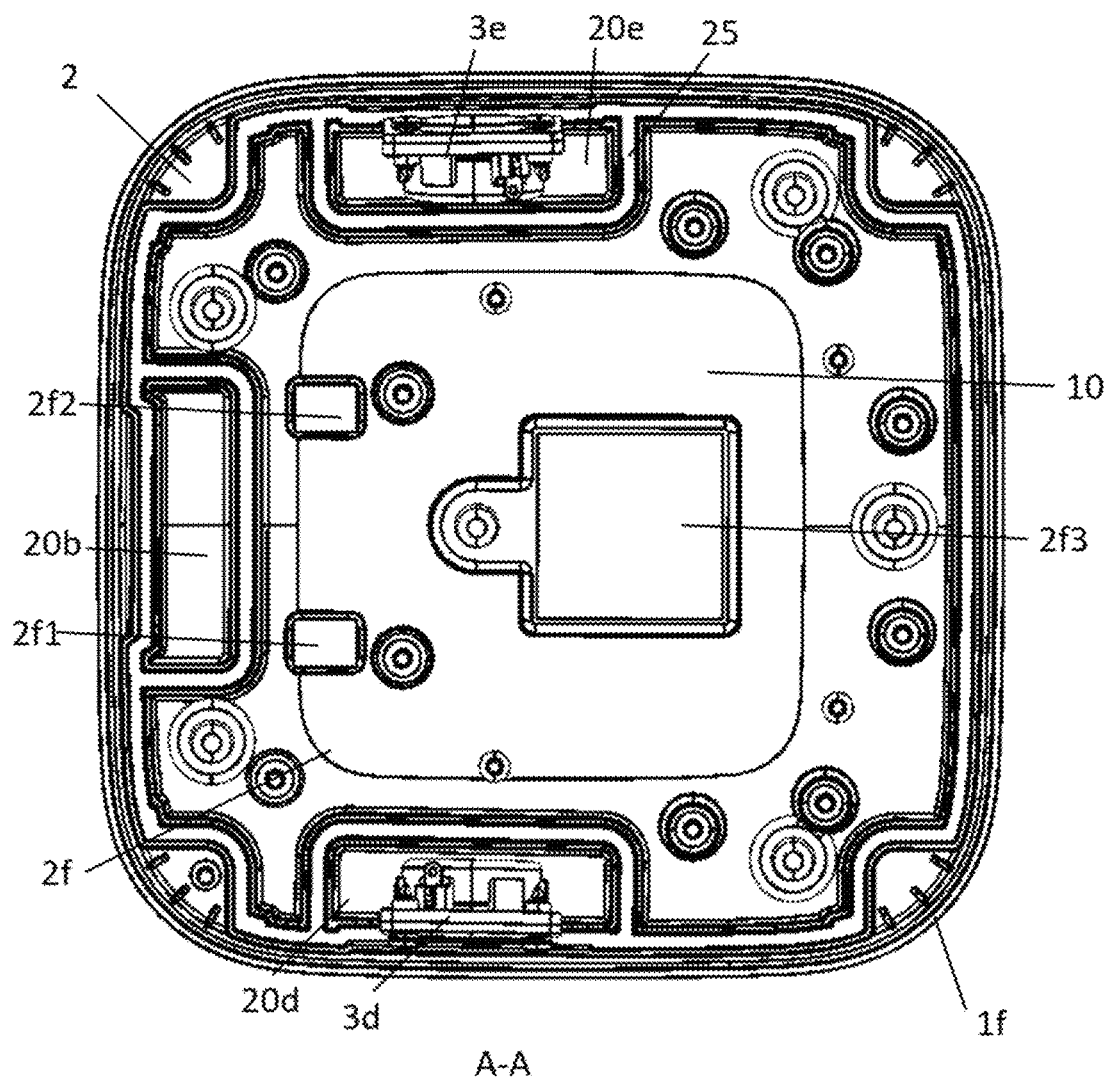
FIG. 6 is a top view of the bottom of the box serving as a heat dissipater and comprising, to this end, bosses 2f1, 2f2, 2f3 to receive heat exchange materials, intended to establish a heat transfer by conduction from the components to be cooled towards the bottom of the box, this figure also shows internal walls 25 at the box 2 which each define sealed chambers 20a, 20, 20d, 20e, each receiving a loudspeaker.

As illustrated in FIG. 6, the bottom 2*f* of the box 2 preferably comprises several bosses 2*f*1, 2*f*2, 2*f*3 (also called disbursements), each disposed to be opposite one of the heat exchanger material blocks 91, 92 which corresponds to it, and which is disposed in the box 2.

Each boss 2*f*1, 212, 2*f*3 is formed to move closer locally to the bottom of the box opposite a heat exchanger material block 91, 92 which corresponds to it.

In this way, the heat flow through the bottom of the box is localised and optimised to the location of the bosses.

In the embodiment illustrated by FIG. 6, the bottom 2*f* comprises three bosses/disbursements 2*f*1, 2*f*2, 2*f*3, one being opposite a lower face of the first loudspeaker 3*a* and the two others being opposite a lower face of the secondary electronic board 6 (one at the implantation of the first amplifier 6*a* and the other at the implantation of the second amplifier 6*b* mounted on the secondary electronic board 6).

Finally, at least one third heat exchanger material block 94 is:
- on one side, in contact against an upper face of at least one electronic component carried by the main electronic board 4 (in this case, against the processor 4*b*); and
- on another side, in contact against a lower face of a main heat dissipater 11 extending between the main electronic board 4 and the upper cover 19 of the casing 1 to discharge the heat generated at the main electronic board 4 outwards from the casing 1.

According to another aspect, the equipment is also equipped with microphones which are, for example, useful for capturing sounds in the environment of the equipment to generate a sound spatial image which is useful for configuring the operation of the loudspeakers and/or for capturing commands emitted by a user (the equipment being able to have a voice recognition and a voice assistant function).

For this, the equipment comprises a plurality of microphones 14*a*, 14*b*, 14*c*, 14*d* disposed inside the casing and connected to the main electronic board 4 by way of one single microphone connector to:
- on the one hand, electrically power this plurality of microphones; and to
- on the other hand, transmit to a microphone module carried by the main electronic board 4, micro signals representative of sounds captured by the microphones.

A first pair of microphones 14*a*, 14*b* is mounted on one same first layer of electrical conductors 15 and a second pair of microphones 14*c*, 14*d* is mounted on one same second layer of electrical conductors 16.

The second layer 16 is electrically connected to said first layer 15.

The first layer 15 extends along a first layer axis and the second layer extending along a second layer axis 16 which is oriented at 90° with respect to the first layer axis.

In this way, the plurality of microphones 14*a*, 14*b*, 14, 14*d* is connected to the main electronic board 4 via one single microphone connector which is particularly economical (simplification of the assembly).

The microphone connector is on the lower face of the main board 4 and cannot be seen in the figures.

Moreover, thanks to the first and second layers 15, 16 disposed at 90° against one another, the first pair of microphones 14*a*, 14*b* is spatially positioned with respect to the second pair of microphones 14*c*, 14*d*.

The accuracy of the spatial positioning of the microphones enables an accurate capturing of the sounds emitted into the environment around the casing 1.

The microphones of the first pair of microphones 14*a*, 14*b* make it possible to capture and differentiate sounds coming from the right or from the left of the casing, while the microphones of the second pair of microphones 14*c*, 14*d* make it possible to capture and differentiate sounds coming from the front or the rear of the casing.

Figure 3A:
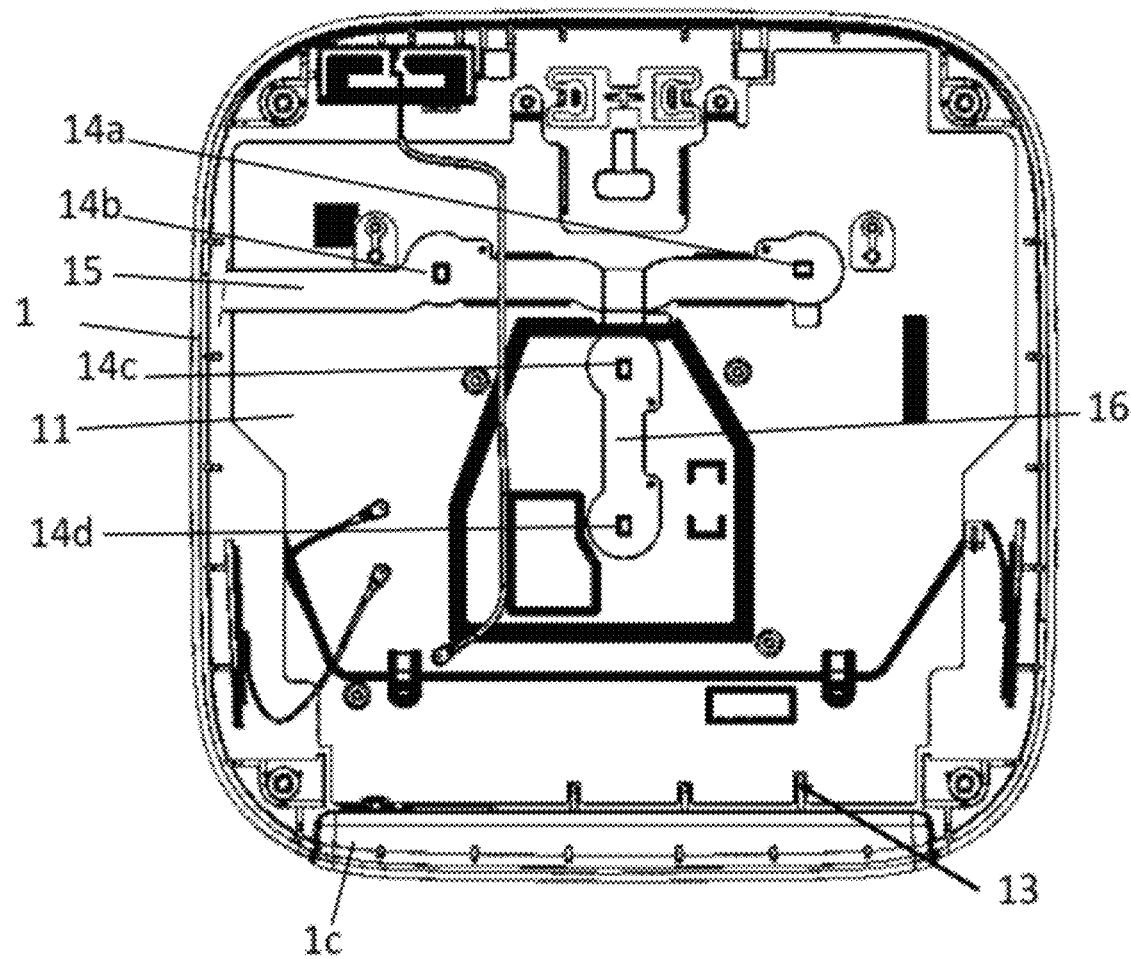
FIG. 3a is a bottom view of the cover 19 of the casing of the equipment, making it possible to illustrate the position of the microphones 14a, 14b, 14c, 14d and the main heat dissipater 11 making it possible to discharge the heat generated at the main board 4.

In the present case, as illustrated in FIG. 3*a*, the first and second layers 15, 16 which carry the two pairs of microphones are mounted on the main heat dissipater 11 (presented above), and which makes it possible to discharge heat from the main electronic board 4.

In this way, the microphones are placed closer to the upper cover 19 of the equipment, which favours the sound capturing quality.

Each microphone is preferably placed above the main heat exchanger 11, i.e. between the main heat exchanger 11 and the cover 1*a* of the casing 1.

Moreover, to achieve the sound capturing, each microphone is placed facing a perforation 21 which corresponds to it, and which passes through the cover 19.

Preferably, the second layer 16 is removably connected to the first layer 15, optionally via a connector.

Alternatively, the second layer 16 is connected to the first layer 15 by a fixed connection, for example, by welding.

In this way, the second layer 16 and the microphones that it carries, can be optional, according to whether a variation of the equipment 0 comprising only a first pair of microphones 14*a*, 14*b*, or a variation comprising two pairs of microphones 14*a*, 14*b*, 14*c*, 14*d* is sought.

This embodiment with two possible variations of the equipment is particularly economical to implement.

Preferably, the microphones of the first pair of microphones are spaced apart from one another by at least 50 mm, preferably 70 mm.

This can be the same for the microphones of the second pair of microphones.

As can be seen in FIGS. 1 and 7*a*, the equipment also comprises a communication electronic board 12 placed in the casing 1 outside of box 2.

This communication board 12 is electrically connected to the main electronic board 4 via a secondary connecting device (in this case, a deformable layer not represented, and comprising a plurality of deformable electrical conductors), so as to electrically power at least one communication electronic element mounted on the communication board 12.

Said at least one communication electronic element belongs to the group of communication electronic elements comprising:
- at least one LED for broadcasting light signals via at least one first optical passage formed through the wall of the casing; and/or
- optionally at least one infrared receiver for receiving infrared signals from a remote control of the equipment, the infrared receiver being positioned facing at least one second optical passage formed through the front part of the wall of the casing; and/or
- optionally at least one camera for generating images of objects located outside of the casing, said at least one camera being positioned facing a third optical passage formed through the front part of the wall of the casing.

The fact of having a communication board 12, distinct and remote vis-à-vis the main electronic board 4, makes it possible to limit the heating of said at least one communication electronic element mounted on the communication board 12.

The service life/ageing of these communication electronic elements is thus improved, as they are less impacted by the heat releases of the main board 4 ("hot board").

In addition, the cooling of the communication electronic board 12 ("cold board") is improved.

The mounting of the communication elements on a dedicated and distinct electronic board of the main electronic board also makes it possible to easily vary the spatial positioning/the height of each of the communication electronic elements (LEDs, infrared receiver and optional camera) with respect to the front face of the casing.

Indeed, as these communication electronic elements are not subservient on the main electronic board 4, they can be positioned in different places in the casing 1, without having to move or adapt the main electronic board 4.

In the embodiment illustrated in FIGS. 1 to 7*b*, it is provided that the communication board 12 is mounted in a reinforcement 25 of the external wall of the box 2 and against an external zone of the wall of the box.

This enables space to be saved inside the casing, while accurately positioning each communication electronic element carried by the communication board opposite the front part of the wall of the casing, which has optical passages.

In the present case, as is understood from the cross-section of FIG. 7*a*, each optical passage 17 corresponds to only one of the communication electronic elements and integrates an optical lens forming an optical flow guide through the front wall 1*b* of the casing.

Preferably, the communication electronic board 12 extends into a plane perpendicular to the main plane of the main electronic board 4 and the communication electronic elements are mounted on a flat main face of the communication electronic board 12, which facilitates the positioning and the assembly of these electronic elements.

Figure 3B:
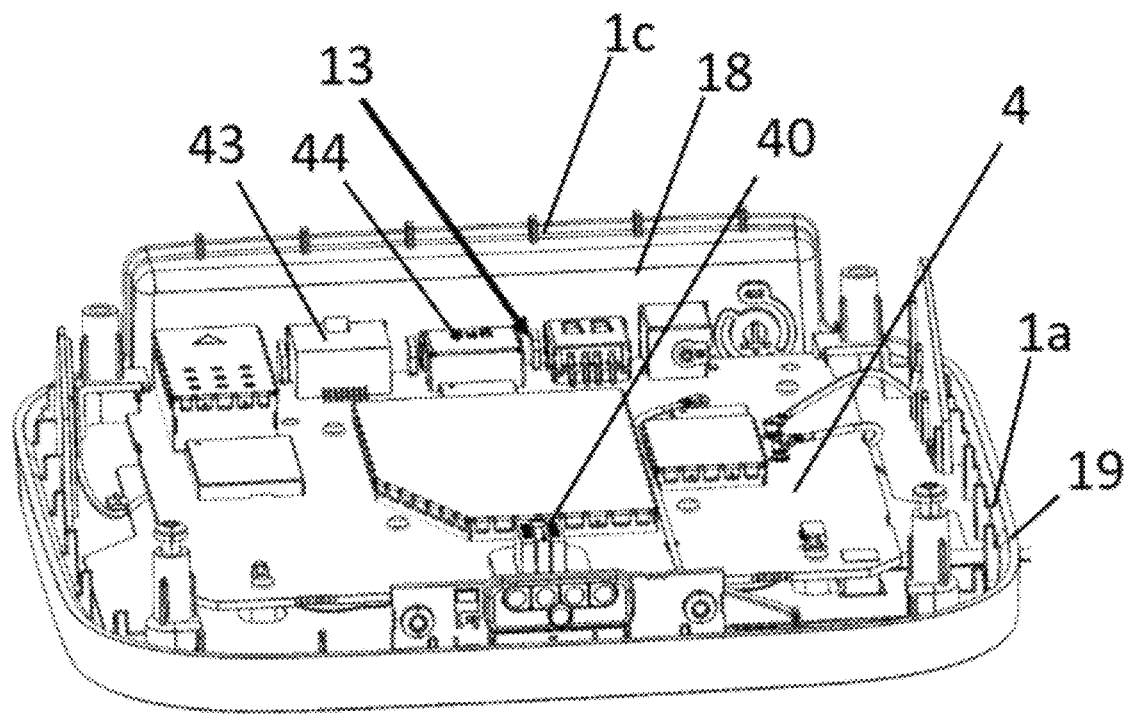
FIG. 3b is a perspective, bottom view of the upper cover 19 of the casing 1 of the equipment 0, where the main electronic board 4 and connectors 43, 44 mounted on this board 4 are seen, and making it possible to connect the equipment 0 to elements external to the equipment.
Figure 3C:
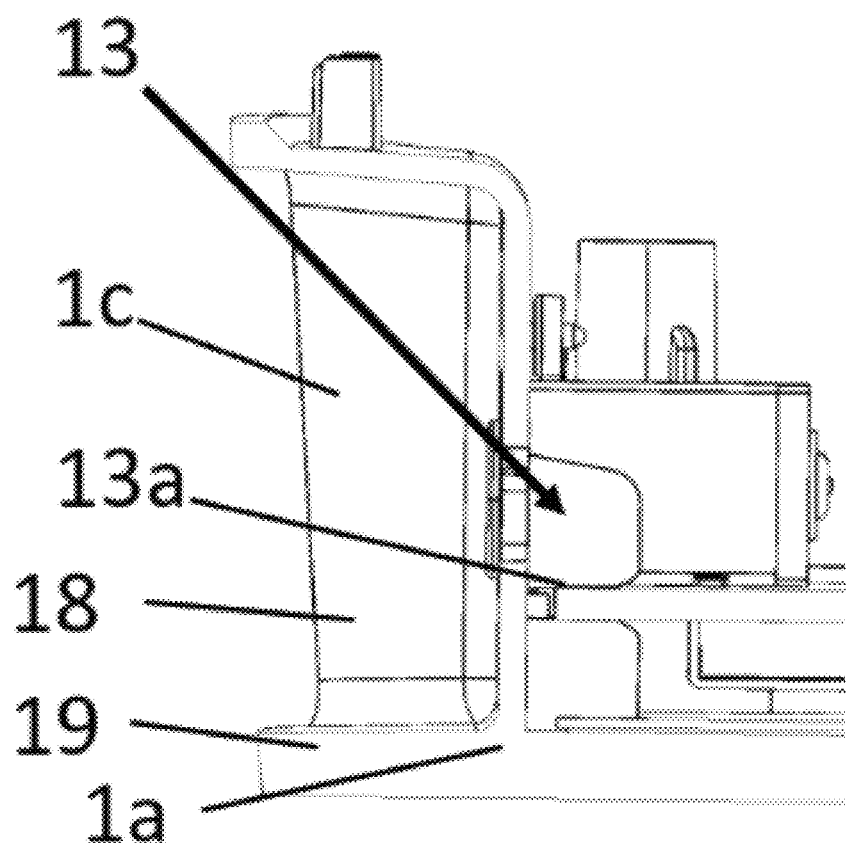
FIG. 3c is a side view of the cover 19 illustrated in FIG. 3b, where ridges 13 with indentations 13a are seen, which make it possible to wedge the main board 4 by wedging on a rear portion of the casing 1 constituted by a rear face 18 of the upper cover 19.

As illustrated in FIGS. 3*a*, 3*b*, 3*c*, ridges 13 supported by a rear face 1*c* of the casing 1 extend inside the casing 1, these ridges 13 each comprising at least one indentation 13*a*.

A rear edge of the main electronic board penetrates inside these indentations, so as to wedge the main electronic board by wedging its rear edge into these indentations 13*a*.

The wedging of the rear edge of the board 4 into the indentations 13*a* of the ridges 13 makes it possible to limit the risk of having vibrations of the main board 4 with respect to the casing 1, also limiting the sound interferences.

It is also possible that an elastically compressible foam is disposed between the rear edge of the main electronic board and at least some of the indentations 13*a* or the bottom of the casing, so as to simplify the adjustment of the main board in the ridges 13, while making it possible to dissipate vibrations in the foam.

More specifically, the rear face 1*c* of the casing 1 is, in this case, partially constituted by a rear portion 18 of the upper cover 19, which extends perpendicularly with respect to a flat main face of the upper cover 19.

The ridges 13 supported by the rear face 1*c* of the casing 1 are, in this case, carried by this rear portion 18 of the cover 19.

The invention is not limited to the examples described above, and it includes any variant entering into the scope defined by the claims.

It must be noted that certain advantages of the box exist, independently of the fact that the box contains or not an audio amplifier, or independently of the number of loudspeakers that it contains.

Thus, another aspect of the invention can also be based on a box comprising a lower face extending mainly in a bottom plane of the box and comprising:
- a flat portion of the front face of the wall of the box on which a front loudspeaker is fixed, forming an angle with the bottom plane of the box, measured inside the box, which is either 90°, or of between 50 and 88° of angle; and/or
- a flat portion of the right side face of the wall of the box on which a right loudspeaker is fixed, forming an angle with the bottom plane of the box, measured inside the box, which is of between 50 and 88° of angle; and/or
- a flat portion of the left side face of the wall of the box on which a left loudspeaker is fixed, forming an angle with the bottom plane of the box, measured inside the box, which is of between 50 and 88° of angle.

As explained above, embodiment enables a this broadcasting upwards of the sounds to orient the sound towards a level higher than the box where the user's head is located.

Likewise, it preferably is achieved, such that each given side wall of the casing, wherein the box is located, is parallel to a main plane defined by one of said loudspeakers carried by the box facing this given side wall of the casing.

This embodiment is advantageous for limiting the distortion of sound broadcast by the loudspeakers through perforations made in the wall of the casing.

Any other placement and/or angle of the walls of the box described above is possible, independently of the fact that the box contains or not an audio amplifier, or independently of the number of loudspeakers that it contains.

In all the embodiments presented above of the equipment according to the invention, said connecting device 5 could be of any type other than the intermediate board.

For example, the connecting device 5 could be a flexible connecting layer carrying the first plurality of electrical conductors 50.

The invention claimed is:

1. Equipment comprising a casing, wherein are located:
   a box;

a first loudspeaker disposed inside the box and mounted at a wall of the box, the first loudspeaker being arranged to broadcast sounds outwards from the casing;

a main electronic board placed in the casing outside of the box and on which is mounted at least one power supply module arranged to produce a first power supply voltage;

a connecting device passing through the wall of the box;

a secondary electronic board placed inside the box and on which is mounted at least one first amplifier connected to the first loudspeaker, the secondary electronic board being electrically connected to the main electronic board via the connecting device, such that the first amplifier is powered by the first power supply voltage, wherein the connecting device comprises an intermediate board carrying a first plurality of electrical conductors to power the first amplifier with the first power supply voltage, the intermediate board and the electrical conductors of said first plurality of electrical conductors passing through an opening formed through the wall of the box.

2. The equipment according to claim 1, wherein the main electronic board carries a first mechanical connector and the secondary electronic board carries a second mechanical connector, the intermediate board carrying, on the one hand, a first mechanical connector of the intermediate board removably connected to the first mechanical connector carried by the main electronic board and carrying, on the other hand, a second mechanical connector of the intermediate board removably connected to the second mechanical connector carried by the secondary electronic board, such that the first power supply voltage is transmitted to the first amplifier by way of the first mechanical connector carried by the main electronic board, first and second mechanical connectors carried by the intermediate board and by the second mechanical connector carried by the secondary electronic board.

3. The equipment according to claim 2, wherein:
one of said first mechanical connectors is a male-type connector interlocked in the other of said first mechanical connectors which is a female-type connector, these first mechanical connectors being connected to one another, so as to have a first clearance enabling a relative movement between these first mechanical connectors, likewise one of said second mechanical connectors is a male-type connector interlocked in the other of said second mechanical connectors which is a female-type connector, these second mechanical connectors being connected to one another, so as to have a second clearance enabling a relative movement between these second mechanical connectors.

4. The equipment according to claim 2, wherein the intermediate board extends in length and in width into a plane of the intermediate board, which is on the one hand, perpendicular to a main plane of the main board, and on the other hand, perpendicular to a front face of the casing.

5. The equipment according to claim 2, wherein the first and second mechanical connectors carried by the intermediate board are identical to one another and the first and second mechanical connectors respectively carried by the main electronic board and by the secondary electronic board are also identical to one another.

6. The equipment according to claim 1, wherein the intermediate board is of asymmetric form, such that the electrical connection between the main electronic board and the secondary electronic board via the first plurality of electrical conductors carried by the intermediate board is possible in one single position of the intermediate board with respect to the main and secondary electronic boards.

7. The equipment according to claim 1, wherein a compressible seal is disposed to oppose the air passage between the inside and the outside of the box via the opening formed through the wall of the box.

8. The equipment according to claim 1, wherein an elastically deformable element, preferably made of foam, extends all around a longitudinal portion of the intermediate board, inside the opening formed through the wall of the box, to oppose the contact between the intermediate board and the wall of the box.

9. The equipment according to claim 1, further comprising an audio module placed in the casing outside of the box and arranged to produce a primary audio signal, the audio module being connected to the secondary electronic board, such that when the primary audio signal is applied at the input of the first amplifier and that the first amplifier is powered by said first voltage, the first amplifier produces a first amplified audio signal sent to the first loudspeaker.

10. The equipment according to claim 9, wherein the audio module is electrically connected to the secondary electronic board by way of the connecting device, such that the primary audio signal is transmitted from the audio module to the first amplifier by way of the connecting device.

11. The equipment according to claim 9, wherein the audio module is mounted on the main electronic board.

12. The equipment according to claim 1, further comprising:
a right loudspeaker disposed in a right inner chamber of the box open on a right side face of the wall of the box;
a left loudspeaker disposed in a left inner chamber of the box open on a left side face of the wall of the box; and optionally
a front loudspeaker disposed in a front inner chamber of the box open on a front face of the wall of the box;
said first loudspeaker being a woofer-type loudspeaker disposed in a central inner chamber of the box disposed between the right and left inner chambers of the box, the central inner chamber of the box being open on an upper face of the box, the right, left, front and central inner chambers of the box being sealed against one another and wherein the right loudspeaker has a main sound axis which is specific to it, and along which the sounds that it generates are mainly broadcast;
the left loudspeaker has a main sound axis which is specific to it, and along which the sounds that it generates are mainly broadcast;
the front loudspeaker has a main sound axis which is specific to it, and along which the sounds that it generates are mainly broadcast;
the casing comprising the casing bottom defining a support plane of the casing; and
at least one of said main sound axes of the right, left and front loudspeakers is oriented with respect to the support plane, such that the sound mainly broadcast along said at least one sound axis moves progressively away from said support plane.

13. The equipment according to claim 12, wherein the main sound axis of the front loudspeaker extends into a plane perpendicular to the support plane where it forms a front angle with respect to the support plane which is of between 2 and 40° of angle, preferably of 3° of angle.

14. The equipment according to claim 1, wherein the secondary board carries at least one energy reserve capacitor electrically powered by the power supply module via the connecting device passing through the wall of the box, said at least one capacitor being moreover electrically connected to said at least one first amplifier, so as to supply energy to said at least one first amplifier.

15. The equipment according to claim 1, wherein a plurality of microphones is disposed inside the casing and is connected to the main electronic board by way of one single microphone connector to, on the one hand, electrically power this plurality of microphones and to, on the other hand, transmit to a microphone module carried by the main electronic board, micro signals representative of sounds captured by the microphones, a first pair of microphones being mounted on one same first layer of electrical conductors and a second pair of microphones being mounted on one same second layer of electrical conductors, the second layer being electrically connected to said first layer, the first layer extending along a first axis layer and the second layer extending along a second axis layer oriented at 90° with respect to the first layer axis.

16. The equipment according to claim 15, wherein the second layer is removably connected to the first layer.

* * * * *